United States Patent
Tago et al.

(10) Patent No.: US 7,282,432 B2
(45) Date of Patent: Oct. 16, 2007

(54) SEMICONDUCTOR DEVICE, MANUFACTURING METHOD AND APPARATUS FOR THE SAME

(75) Inventors: Masamoto Tago, Tokyo (JP); Tomohiro Nishiyama, Tokyo (JP); Tetuya Tao, Tokyo (JP); Kaoru Mikagi, Tokyo (JP)

(73) Assignee: NEC Corporation, Tokyo (JP)

( * ) Notice: Subject to any disclaimer, the term of this patent is extended or adjusted under 35 U.S.C. 154(b) by 29 days.

(21) Appl. No.: 11/144,753

(22) Filed: Jun. 6, 2005

(65) Prior Publication Data

US 2005/0279812 A1 Dec. 22, 2005

Related U.S. Application Data

(62) Division of application No. 10/043,225, filed on Jan. 14, 2002, now Pat. No. 6,969,915.

(30) Foreign Application Priority Data

Jan. 15, 2001 (JP) .............................. 2001-005977
Jun. 6, 2001 (JP) .............................. 2001-170787

(51) Int. Cl.
*H01L 21/44* (2006.01)

(52) U.S. Cl. ...................... 438/613; 438/614; 438/615; 257/E21.508; 257/E21.592

(58) Field of Classification Search ................ 438/613, 438/614, 615; 257/E21.508, E21.509, E21.592
See application file for complete search history.

(56) References Cited

U.S. PATENT DOCUMENTS 5,471,092 A 11/1995 Chan et al.
5,902,686 A 5/1999 Mis
6,013,572 A 1/2000 Hur et al.
6,184,061 B1 2/2001 Wu et al.
6,201,305 B1 3/2001 Darveaux et al.
6,224,690 B1 5/2001 Andricacos et al.
6,417,089 B1 * 7/2002 Kim et al. .................. 438/612
6,429,046 B1 8/2002 Marlin
6,476,494 B1 11/2002 Hur et al.
6,492,197 B1 * 12/2002 Rinne .......................... 438/108
6,570,251 B1 * 5/2003 Akram et al. ............... 257/738
6,689,680 B2 * 2/2004 Greer ......................... 438/614

FOREIGN PATENT DOCUMENTS

| EP | 1 035 583 A2 | 9/2000 |
| JP | 9-36120 | 2/1997 |
| JP | 9-181125 A | 7/1997 |
| JP | 2000-150574 A | 5/2000 |
| KR | 1995-8844 B1 | 8/1995 |
| WO | WO98/09332 A1 | 3/1998 |

* cited by examiner

*Primary Examiner*—Trung Dang
(74) *Attorney, Agent, or Firm*—Sughrue Mion, PLLC

(57) ABSTRACT

A highly reliable semiconductor chip electrode structure allowing control of interface reaction of bonding sections even in the case of using two- or three-element solder used conventionally is disclosed. A solder alloy making layer for preventing dissolving and diffusion of tin into tin-based lead free solder is thinly formed on a UBM layer. The tin-based solder is supplied in solder paste or solder ball form. A combined solder alloy layer composed of a combination of intermetallic compounds, one of tin and the solder alloy making layer, and one of tin and the UBM layer, is formed by heating and melting.

20 Claims, 12 Drawing Sheets

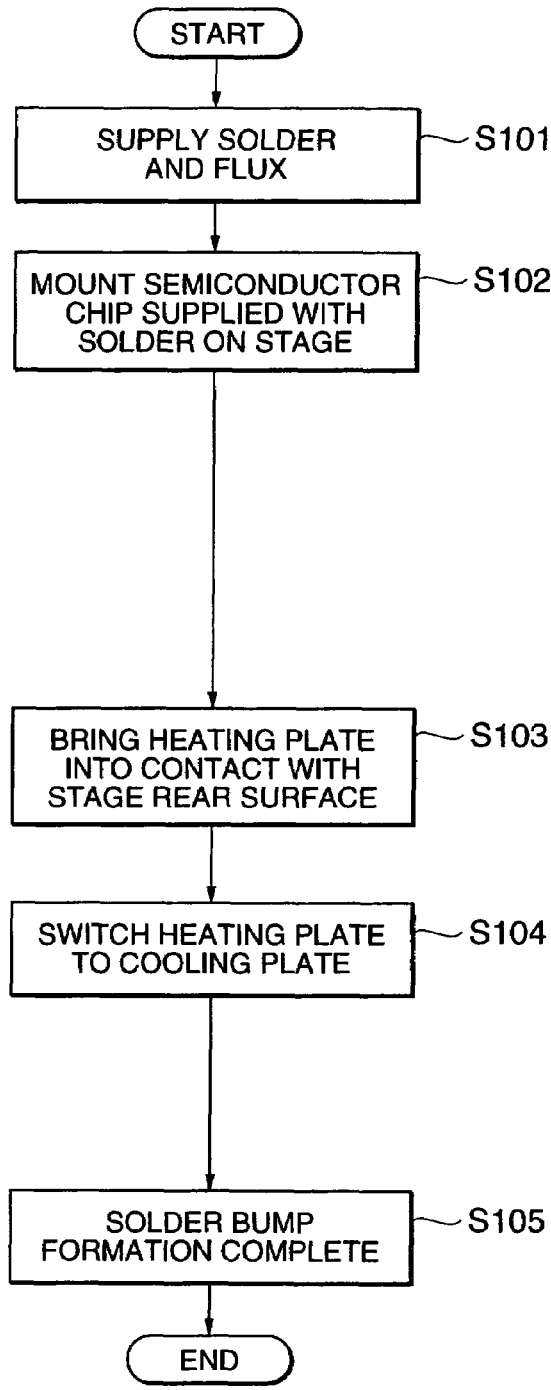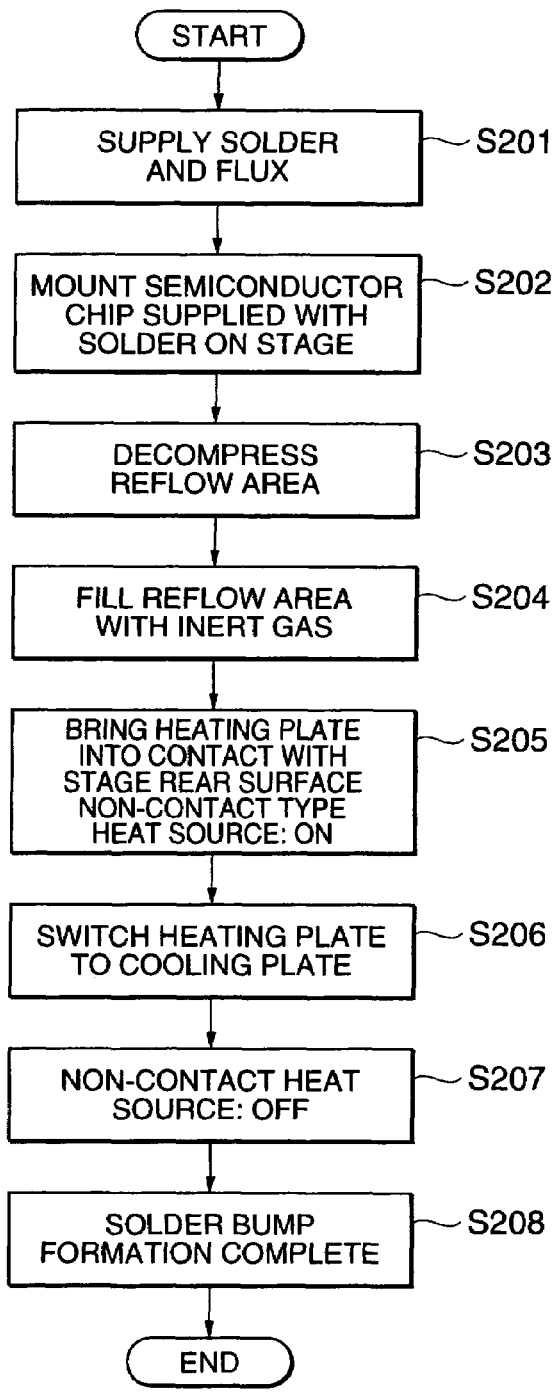

SEMICONDUCTOR CHIP SUPPLIED WITH SOLDER
1a
19 STAGE 1a
19
20 HEATING PLATE 1a
19
21 COOLING PLATE

SEMICONDUCTOR DEVICE, MANUFACTURING METHOD AND APPARATUS FOR THE SAME

This is a divisional of application Ser. No. 10/043,225 filed Jan. 14, 2002 now U.S. Pat. No. 6,969,915. The entire disclosure of the prior application, application Ser. No. 10/043,225 is hereby incorporated by reference.

BACKGROUND OF THE INVENTION

1. Field of the Invention

The present invention relates to a semiconductor device, a method and apparatus of manufacturing the semiconductor device, and particularly to a semiconductor device having an electrode structure connected by lead-free solder bumps, a method of manufacturing this semiconductor device, and a manufacturing apparatus used in this semiconductor manufacturing method.

2. Description of the Related Art

Accompanying the increased functionality and increased density of semiconductor devices, there has been an increasing number of semiconductor packages connecting a multipin semiconductor chip to a package substrate by solder bumps, and semiconductor packages having ball grid array (BGA) type external electrodes. In electrodes of this type of semiconductor chip, the surface boundaries of bonded sections vary in composition due to reactions between metals caused by heat history at the time of assembly, heat history at the time of mounting the semiconductor package and high temperature states and temperature changes in the usage environment. This may cause degradation in reliability, and one important element in addressing this problem is to select respective materials in order to give a metallic composition allowing reliability to be kept.

In order to do this, as shown in FIG. 5, it is common practice, when using solder composed of tin and lead as bumps, to use nickel or copper in a UBM (under bump metal) layer 5, and to carry out bonding using this UBM layer 5 formed to a film thickness of at least 5 µm. In the case of a nickel layer, tin and nickel in the solder react to form an intermetallic compound 11 by which the bump is bonded. In the event of a copper layer, an interface forms an intermetallic compound 11 of the tin and copper and bonds.

The reactivity of copper and tin is higher than that of nickel and tin, but in either case in the fused state at the time of bonding, and also under a temperature environment after bonding, a diffusion reaction is promoted and tin constituting the solder erodes the nickel or copper layer that is the UBM layer 5. As a result, there are problems such as tin being consumed at the bonding interface forming areas where lead density is high, and Kirkendall voids due to diffusion of tin, which are likely to reduce strength. In order to solve these problems, currently, a method of forming a thick layer of copper or nickel is used, or high melting point lead-rich solder with reducing tin content is used.

However, in recent years there have been moves towards lead free solder, mainly due to environmental problems, making it necessary to use solder having tin as the main component. With this type of solder with tin as a main component, in the case of using copper or nickel as the UBM layer 5 the above described problems are more evident, and seriously affect reliability.

Generally, in order to solve these problems, from the standpoint of solder wettability and mechanical characteristics, there is used solder having silver bismuth, antimony or zinc added to the main component of tin, or solder that is a multiple component alloy having elements for preventing eating-away and diffusion of the UBM layer 5 formed from copper and nickel, added to silver, bismuth, antimony or zinc.

However, multiple component solder is generally supplied as solder pastes or balls to each electrode, which means that keeping microscopic additional elements uniform in the composition of each electrode is difficult. Keeping uniformity of microscopic additional elements would increase manufacturing costs.

Also, a result of having additional elements for preventing eating away and diffusion is that additional elements are previously dissolved in the tin that is the main component, and melting or solid-dissolution of the UBM layer 5 into the solder at the time of bonding stops at the lower limit, but the total amount of the UBM layer 5 dissolved varies depending on the bonding temperature. In order to bond stably it is necessary to increase the temperature, normally excessively dissolving the UBM layer 5. In order to prevent this phenomenon of the UBM layer being excessively dissolved it is necessary to include a lot of additional elements, but as a result the melting point becomes high and thermo stability at the time of manufacture must be taken into consideration, which poses serious questions for product design.

Also, as shown in FIG. 15, a reflow furnace for melting solder and making bonding sections is a system for passing through areas for preliminary heating, and actual heating and cooling that are temperature controlled by infra red rays or hot air, at a fixed speed using a conveyor, but with this system temperature control is difficult as the device is passed by the conveyor through each area, it is not possible to form an intermetallic compound of the bonding sections as was intended by the material design, and because of vibration of the conveyor while transporting within the furnace there is damage to a semiconductor wafer or chip, with solder bridges arising due to movement of the formed solder causing reduction in the product yield.

Japanese Patent Application Unexamined Publication No. 9-36120 discloses a solder bump electrode structure allowing enhanced bonding strength by preventing an intermetallic compound from being formed by diffusion of the solder and barrier metal. More specifically, a barrier metal layer, a first UBM layer, a second UBM layer, and a solder bump are laminated in this order on a bonding pad of the semiconductor chip. The first UBM layer is allowed to be alloyed with material of the solder bump. The second UBM layer includes metal that is also included in the solder bump and not allowed to be alloyed with the barrier metal layer, wherein the concentration of the metal in the second UBM layer is higher than that of the same metal in the solder bump.

SUMMARY OF THE INVENTION

A first object of the present invention is to provide a highly reliable semiconductor chip electrode structure that can control interface reaction of bonding sections without using solder of a multiple alloy metallic composition with many microscopic elements added, even in the case of using two- or three-element solder used conventionally.

A second object of the present invention is to provide a highly reliable semiconductor device having the above-described electrode structure, and a method of manufacturing such a device.

A third object of the present invention is to provide a semiconductor manufacturing apparatus that can easily per-form temperature control of the semiconductor chip, and can control melting of solder and deposition of intermetallic compound.

In order to achieve the above-described objects, a semiconductor device according to one aspect of the present invention has at least solder bumps formed of alloy solder on an under-bump layer including first metal formed on a wiring layer, and an intermetallic compound including metal that is a main component of the alloy solder with a second metal different from the metal that is the main component of the alloy solder being formed between a solder bump and the under-bump layer.

A semiconductor device of another aspect the present invention also has at least solder bumps formed of alloy solder on an under-bump layer including first metal formed on a wiring layer, and has an alloy layer, made of a combination of an intermetallic compound of a metal that is a main component of the alloy solder and a second metal different from the metal that is a main component of the alloy solder, and an intermetallic compound of the first metal included in the under-bump layer and metal that is the main component of the alloy solder, formed between the solder bumps and the under-bump layer A semiconductor device of yet another aspect of the present invention further has at least solder bumps formed of alloy solder on a under-bump layer including first metal formed on a wiring layer, and an intermetallic compound including a second metal, temporarily arranged on the under-bump layer and constituting a metal layer for dissolving into the alloy solder at the time of formation of the solder bumps, and a metal that is a main component of the alloy solder, formed between the solder bumps and the under-bump layer.

A semiconductor device of a further aspect of the present invention still further has at least solder bumps formed of alloy solder on an under-bump layer including first metal formed on a wiring layer, and an alloy layer that is a combination of an intermetallic compound, including a second metal, temporarily arranged on the under-bump layer and constituting a metal layer for dissolving into the alloy solder at the time of formation of the solder bumps, and a metal that is a main component of the alloy solder, and an intermetallic compound of the first metal included in the under-bump layer and metal that is the main component of the alloy solder, formed between the solder bumps and the under-bump layer.

In the present invention, it is possible to have a configuration where metal that is a main component of the alloy solder is tin, the next most prevalent component after tin is silver, and copper is added to the alloy solder.

In the present invention, it is also preferable for the second metal constituting the metal layer to be a metal different from copper or the first metal, and to be made of a metal constituting the intermetallic compound with tin.

It is also preferable in the present invention for the first metal included in the under-bump layer to include nickel, and for the under-bump layer to be formed as a laminated film comprising a laminated film of nickel or nickel alloy of differing film quality, or laminated film of nickel or nickel alloy, and copper or copper alloy.

In the present invention, it is also preferable to have a structure where an contact layer is arranged between the wiring layer and the under-bump layer, and the contact layer includes titanium or titanium/tungsten alloy.

A semiconductor device manufacturing method of one aspect of the present invention for manufacturing a semiconductor device comprises at least solder bumps of alloy solder formed on a wiring layer via an under-bump layer including a first metal, in which when forming the solder bumps, after temporarily fusing alloy solder having a second metal added different from a metal that is a first component, a metallic compound including the second metal and metal that is a main component of the alloy solder is deposited at an interface between the under-bump layer and the solder bumps by cooling.

A semiconductor device manufacturing method of another aspect of the present invention comprises the steps of forming an under-bump layer, including a first metal formed of a first intermetallic compound at an interface on a wiring layer through reaction with alloy solder, supplying alloy solder having a second metal different from main component metal added, and forming an alloy layer being a combination of the first intermetallic compound and a second intermetallic compound of a main metal of the alloy solder and a second metal, at an interface between the under-bump layer and the alloy solder by cooling the alloy solder after temporary fusing.

A semiconductor device manufacturing method of a further aspect of the present invention, is for forming a semiconductor device comprising at least solder bumps of alloy solder formed on a wiring layer via a under-bump layer including a first metal, in which, when forming a metal layer made from a second metal on the under-bump layer and forming the solder bumps, after temporarily fusing the entire metal layer on the alloy solder, an intermetallic compound including the second metal and a metal being a main component of the alloy solder is deposited at an interface between the under-bump layer and the solder bumps by cooling.

A semiconductor device manufacturing method of another aspect the present invention comprises the steps of forming an under-bump layer, including a first metal constituting a first intermetallic compound at an interface on a wiring layer through reaction with alloy solder, forming a metal layer, made from a second metal constituting a second intermetallic compound through reaction with the alloy solder, supplying the alloy solder, and, after temporary fusing of the alloy solder, forming an alloy layer that is a combination of the first intermetallic compound and the second intermetallic compound at an interface between the under-bump layer and the alloy solder by cooling.

A semiconductor device manufacturing method of yet another aspect the present invention comprises the steps of forming a under-bump layer, including a first metal constituting a first intermetallic compound at an interface on a wiring layer through reaction with alloy solder, forming a metal layer made from a second metal constituting a second intermetallic compound through reaction with the alloy solder, forming a thin film of tin on the metal layer and previously forming an alloy layer of the second metal and the tin, and supplying the alloy solder.

With the present invention, when forming the solder bumps, it is preferable to carry out fusing of the alloy solder and deposition of the intermetallic compound by setting a temperature of an interface between the solder bumps and the contact layer to a specified temperature gradient lower than a maximum temperature.

It is also referable with the present invention, when forming the solder bumps, to mount the semiconductor device on a stage, and to carry out fusing of the alloy solder and deposition of the intermetallic compound by causing a heating plate and a cooling plate movably provided at a lower part of the stage to be sequentially brought into contact with the stage.

In the present invention, it is also preferable, at the time of heating using the heating plate, to also heat the semiconductor device from above by non-contact heating means provided at an upper part of the semiconductor device, and at the time of cooling using the cooling plate, while continuing heating using the non-contact heating means, to increase a temperature gradient of an interface between the top of the solder bumps and the contact layer to promote deposition to the interface between the intermetallic compound and the contact layer.

It is further preferable, with the present invention, to have a structure where the heating using the heating plate and the cooling using the cooling plate are carried out under a vacuum atmosphere of a specified gas, and for the specified gas to include either an inert gas or a reductive gas.

It is still further preferable, with the present invention, for the contact layer to be a single film or a laminate of a plurality of films of any of nickel, nickel alloy, copper or copper alloy formed by sputtering, or to be a single film or a laminate of a plurality of films of any of nickel, nickel alloy, copper or copper alloy formed by sputtering, nonelectrolytic plating or electrolytic plating, or a laminate film of these.

It is also preferable in the present invention for the metal layer to include a copper thin film formed by any one of sputtering, nonelectrolytic plating or electrolytic plating, or by a plurality of methods.

In the present invention, it is also preferable to set the film thickness of the metal layer so that the metal layer fuses totally into the alloy solder when fusing the alloy solder, and so that when cooling the alloy solder at least some of the alloy solder is deposited.

The present invention can also have a structure where the alloy solder is supplied using a ball or pellet formed to a specified amount, or using solder paste.

A semiconductor manufacturing apparatus of the present invention comprises at least a stage for mounting a sample, heating means for heating the sample from below, and cooling means for forcibly cooling the sample from below.

Another aspect of the semiconductor manufacturing apparatus of the present invention comprises at least a stage for mounting a semiconductor device having solder, heating means for heating the semiconductor device, and cooling means for cooling the semiconductor device from below.

In the present invention, it is possible to have a structure where the heating means is made from a heating plate with a built-in heater, the cooling means is made from a cooling plate with a built in cooling medium, and heating and cooling are carried out by sequentially bringing the heating plate and the cooling plate into contact with a lower surface of the stage to conduct heat.

In the semiconductor manufacturing apparatus of the present invention, it is further possible to have a structure comprising non-contact heating means at an upper part of the stage for heating the sample or the semiconductor device from above without contact.

With the above described semiconductor chip electrode structure, compared to the related art structure where tin type multiple component alloy solder is supplied to a under-bump layer, and a single intermetallic compound layer is formed using tin at an interface between the under-bump layer and bumps, and the under-bump layer, by heat fusion, a solder alloy making layer for preventing melting and diffusion of the tin is formed thinly, tin type two element or three element alloy solder is supplied in solder paste or solder ball form, and a solder alloy layer 6, having an intermetallic layer combined with every two tin and solder alloy making layers and tin and under-bump layers, is formed by carrying out heat fusion.

In this way, by thinly providing a solder alloy making layer in advance on the under-bump layer, the obtained solder bump structure is comprised of two or three element alloy solder with tin as a main component, a first intermetallic compound from reaction of tin in the solder and the solder alloy making layer, and a second intermetallic layer from reaction of tin in the solder with the under-bump layer, and constitutes a boundary interface at a combined solder alloy layer.

With the combined solder alloy layer that is a combination of the first and second intermetallic compounds, since when melting the solder the whole of the thin solder alloy making layer becomes the first intermetallic compound layer and is formed at substantially the same time as the second intermetallic compound is formed, the first intermetallic compound acts to cut off a diffusion path where the second intermetallic compound is grown.

Also, since the combined solder alloy layer is formed from different materials, a concentration gradient is discontinuous and the grain boundary is dense compared to a single layer, making it possible to suppress the advancement of diffusion. Further, since the melting point of the deposited intermetallic compound is higher than the melting point of the solder alloy, there is the effect of preventing the intermetallic compound dissolving in the solder, even if the solder is melted again during subsequent manufacturing processes or mounting.

Accordingly, the intermetallic compound layer, of the tin within the solder and the under-bump layer, grown due to diffusion under normal circumstances, suppresses growth due to the first intermetallic compound being arranged in a diffusion path such as the grain boundary or the like, achieving the effect of obtaining a highly reliable bonding interface having low deterioration with age with respect to temperature variations due to repeating heat history during assembly and usage conditions after assembly.

With the semiconductor manufacturing apparatus of the present invention, a stage for mounting a semiconductor chip, a heat source for heating the stage and a cooling source for forcibly cooling the stage are included, it is possible to select a different heating rate and cooling rate for each of the preparatory heating, actual heating and cooling stages, and in particular it is possible to make the cooling rate extremely fast, and it is then possible to form an intermetallic compound that is a combined at an interface of solder and the under-bump layer by cooling from the rear surface of the semiconductor chip. Also, in order to make these effects more striking, a non-contact type heat source is provided above the semiconductor chip, and the semiconductor chip is also heated from above when cooling from the cooling plate, to enable increase in the temperature gradient above and below the semiconductor chip, specifically the top and bottom of the solder, and to enable even further promotion of deposition and formation of the combined intermetallic compound at the solder interface.

BRIEF DESCRIPTION OF THE DRAWINGS

FIG. 11A is a flow chart showing an example of a manufacturing process for the semiconductor device according to the second embodiment of the present invention;

FIG. 11B is a flow chart showing another example of a manufacturing process for the semiconductor device according to the second embodiment of the present invention;

DESCRIPTION OF THE PREFERRED EMBODIMENTS

First Embodiment

Figure 1:
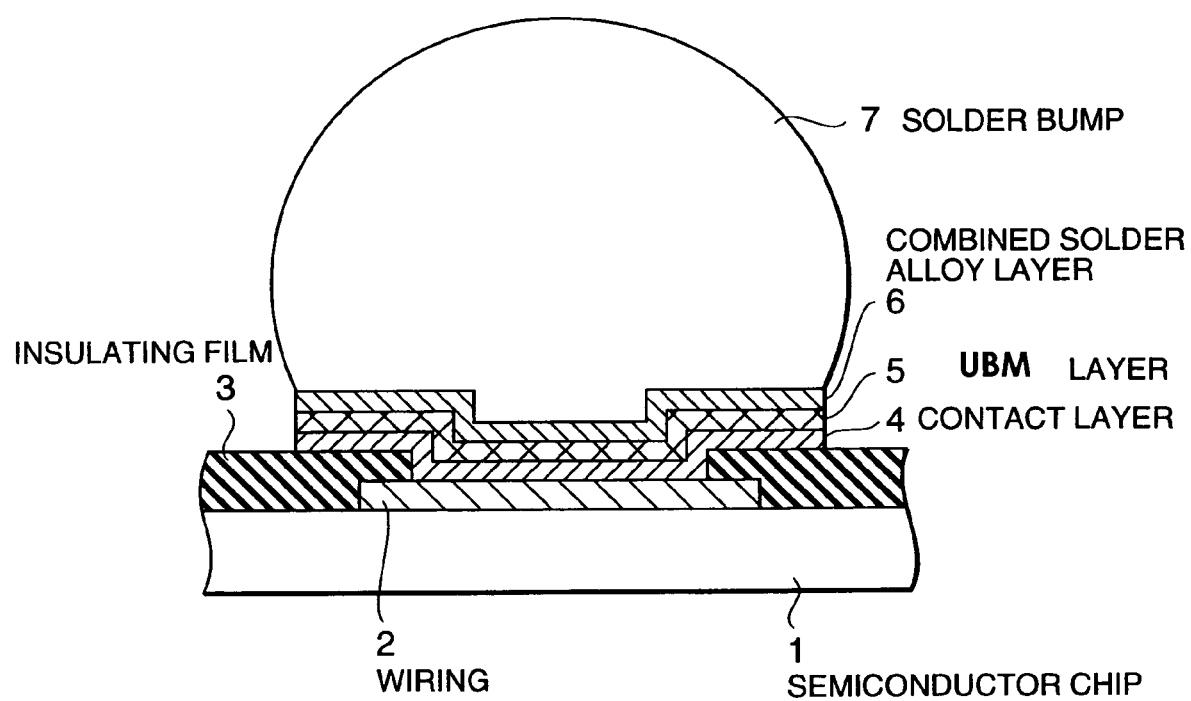
FIG. 1 is a cross sectional view showing the structure of a semiconductor device according to a first embodiment of the present invention.
Figure 2:
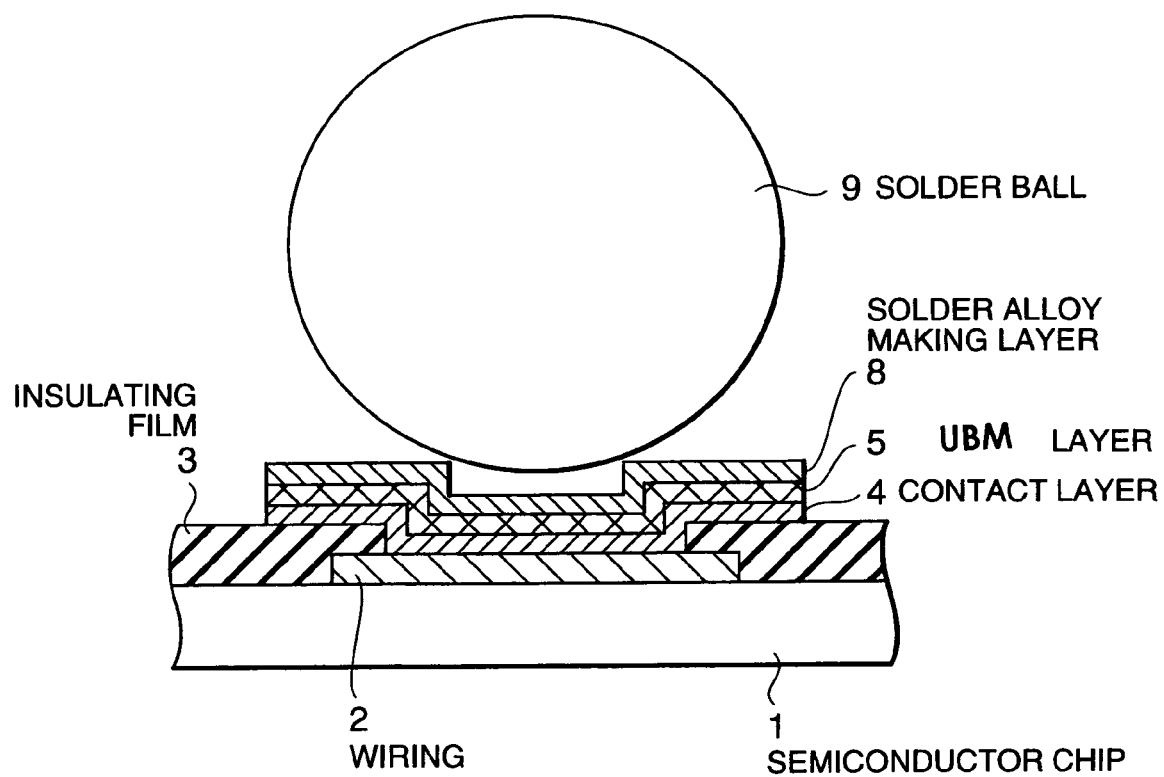
FIG. 2 is a cross sectional view showing the structure of the semiconductor device according to the first embodiment of the present invention before solder bump formation using a solder ball.
Figure 3:
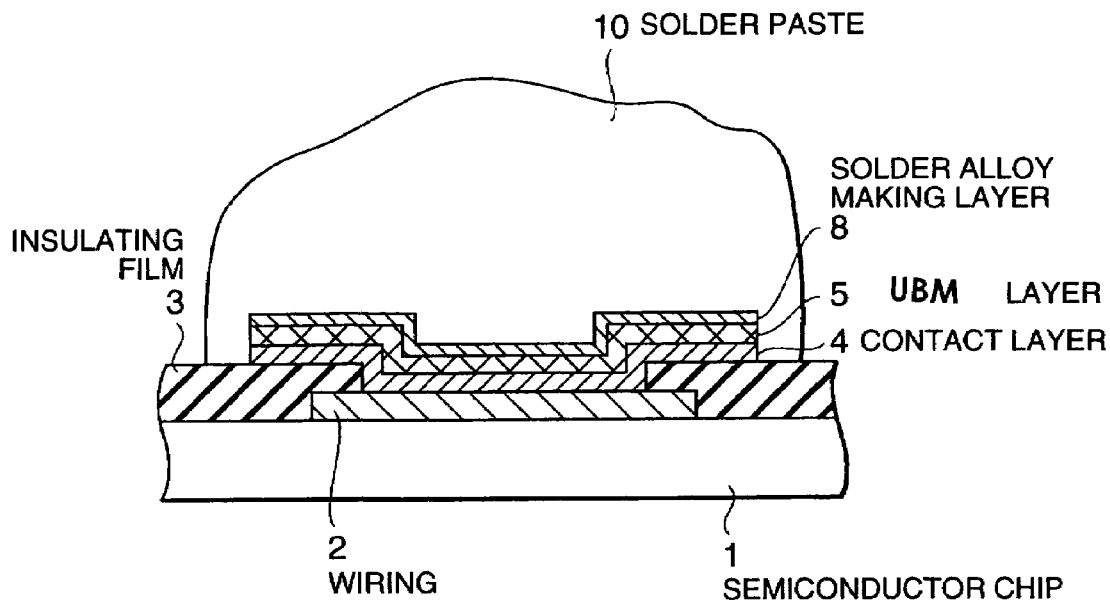
FIG. 3 is a cross sectional view showing the structure of the semiconductor device according to the first embodiment of the present invention before solder bump formation using solder paste.

First of all, a semiconductor device according to a first embodiment of the present invention, and a method of manufacturing this semiconductor device, will be described in detail with reference to FIGS. 1-3. FIG. 1 shows the bump structure of the semiconductor device. FIG. 2 shows the electrode structure before forming solder bump in the case of supplying solder as a solder ball, and FIG. 3 shows the electrode structure before forming solder bump in the case of supplying solder as solder paste.

As shown in FIG. 2, on wiring 2 of a semiconductor chip 1, an electrode is formed, which is composed of a contact layer 4 for obtaining intimate contact with a metal constituting the wiring 2, a UBM (under bump metal) layer 5 turned into alloy through reaction with solder, and a solder alloy making layer 8 thinly formed using metal that is different to the UBM layer 5 allowed to be alloyed with the solder. A two-element or three-element solder ball 9 with tin as a main component and containing no lead is supplied onto this electrode.

In this state, when the solder ball 9 is heated and fused, the solder alloy making layer 8 reacts completely with tin in the solder, and is temporarily dissolved in the tin. Tin in the solder then simultaneously dissolves the UBM layer 5. Since the overall amount dissolved in the tin in the solder is determined by the melting temperature, if cooling is commenced in this state an intermetallic compound layer is formed at the bonding interface, but in the case of this embodiment a combined solder alloy layer 6, being a combined layer of the intermetallic compound, is formed because metal constituting the solder alloy making layer 8 being dissolved in the tin and metal constituting the UBM layer are both simultaneously subjected to deposition of intermetallic compound at the bonding interface.

The important point here is that with respect to the solder alloy making layer 8, there is only an amount that can be dissolved with respect to tin in the tin-based two- or three-element alloy solder ball 9 and it is necessary to determine film thickness taking into consideration that it will be deposited at the time of cooling. When the dissolved amount is small, the solder bump 7 directly dissolved in the tin is solidified without being deposited at the time of cooling, which means that such a combined film of intermetallic compound is not formed.

FIG. 1 shows a cross section of the solder bump 7 obtained in the above way. Once a combined solder alloy layer 6 has been formed as an intermetallic compound combined layer, the melting point of the intermetallic compound is high, and therefore the phenomenon of the UBM layer 5 at the bonding interface dissolving does not occur, even with a heat history above the solder melting temperature at the time of assembly. Further, the diffusion phenomenon caused by a heat history below the melting temperature is also suppressed because the intermetallic compound combined layer is arranged at the grain boundary.

In order to be more specific, a description will now be given for use of a typical metal composition in the case of using eutectic solder having 96.5 weight % tin and 3.5 weight % silver in a tin-based two-element alloy solder ball 9 as lead-free solder.

The wiring 2 of the semiconductor chip 1 is normally formed with aluminum or aluminum alloy. The contact layer 4 of titanium or titanium/tungsten alloy etc., the UBM layer 5 of nickel/vanadium alloy etc., and the solder alloy making layer 8 of copper etc. are formed by sequential sputtering to form an electrode. Here, the film thickness of copper making up the solder alloy making layer 8 is preferably such that it dissolves completely at the time of dissolving, with respect to the proportion of tin contained within the solder ball 9, and enables deposition at the interface as an intermetallic compound at the time of cooling and solidification, that is, a supersaturated amount. However, if the amount of copper supplied is excessive, it will be necessary to take care because there will be severe unevenness on the surface of the formed solder bump 7, and wettability at the time of fusing will deteriorate with a possibility of voids occurring.

Titanium or titanium/tungsten alloy is used in the contact layer 4, but it is also possible to use chrome or chrome/copper alloy, and similarly although nickel/vanadium alloy has been used in the UBM layer 5 it is also possible to use nickel, nickel/phosphorous alloy, nickel/tungsten alloy, nickel chrome alloy, copper or copper alloy. Also, the solder alloy making layer 8 that is one feature of the present invention uses copper, but it is also possible to use a material that is different from the UBM layer 5 and is a metal constituting an intermetallic compound with tin in the solder.

Also, with this embodiment, the UBM layer 5 and the solder alloy making layer 8 are both formed by sputtering, but they can also be formed by electrolytic plating or nonelectrolytic plating, or in combination with sputtering, and it is also possible to use different material and to have a laminate structure formed by a combination of different methods. For example, as the UBM layer 5, it is possible to have a structure where nickel formed by electrolytic plating is laminated on nickel or copper formed by sputtering. By adjusting conditions at the time of film formation it is possible to have a granular structure with small grain size to improve film quality. Also, since the solder alloy making layer 8 uses a material such as copper which is likely to be subjected to surface oxidation, it is possible to provide extremely thin gold or a layer for preventing oxidation to promote solder wettability on the solder alloy making layer 8 for the purpose of preventing oxidation to improve solder wettability.

In addition, although this example shows a tin-based two-element alloy used as the solder, it is also possible use a three-element alloy solder having microscopic amounts of copper added to the solder, or to use other multiple element alloy solders. Also, although in this embodiment a structure where the solder alloy making layer 8 is formed on the UBM layer 5 is disclosed, in the case where an element constituting the solder alloy making layer 8 is added in to the solder, it is possible to do away with the solder alloy making layer 8.

Second Embodiment

Next, in a semiconductor device according to a second embodiment of the present invention and a method and apparatus of manufacturing this semiconductor device will be described with reference to FIG. 6 to FIG. 13.

Figure 6:
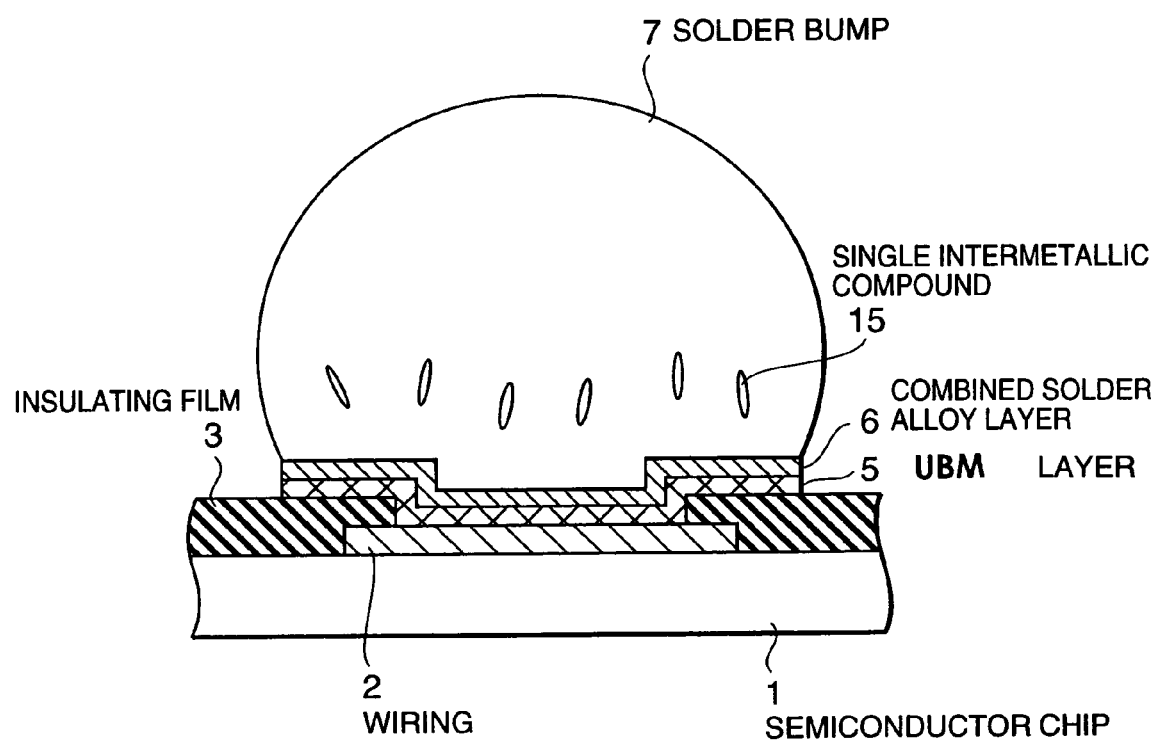
FIG. 6 is a cross sectional view showing the structure of a semiconductor device according to a second embodiment of the present invention.

As shown in FIG. 6, a combined solder alloy layer 6 is formed between the UBM layer 5 and the solder bump 7. The combined solder alloy layer 6 is made of a combination of an intermetallic compound of a metal that is a main component of the solder and a metal constituting a UBM layer 5, and a second intermetallic compound comprised of the main component of the solder and a metal previously added in microscopic amounts to the alloy solder or thinly formed in advance on the UBM layer 5. In heating and cooling processes at the time of forming the solder bump, this combined solder alloy layer 6 is deposited at an interface according to a composition of the solder bumps and conditions, and therefore it is made possible to control the structure.

Figure 9:
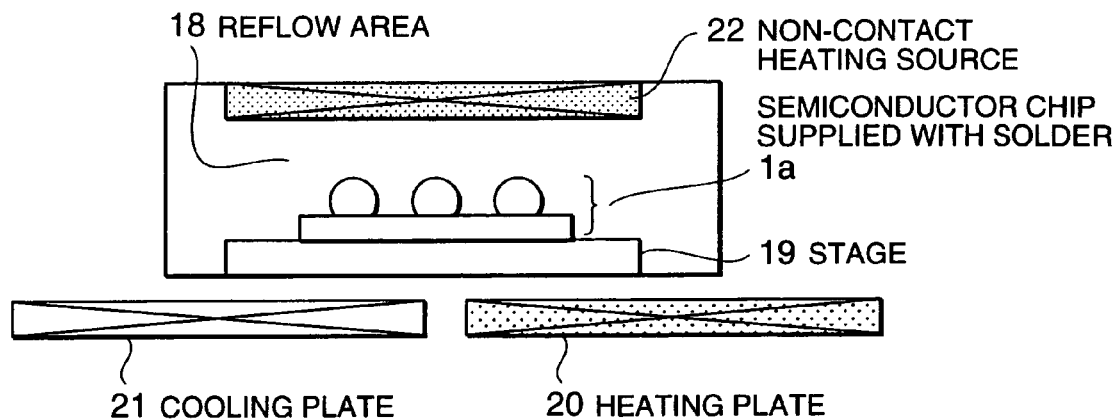
FIG. 9 is a cross sectional view showing an example of a reflow apparatus for forming the semiconductor device according to the second embodiment of the present invention.

Referring to FIG. 9, a manufacturing process including the heating and cooling processes for obtaining the above structure, and a manufacturing device, will be described in detail. The semiconductor chip 1*a* to which solder has been supplied is arranged on a stage 19 inside a reflow machine, and a reflow area 18 is made capable of being decompressed and filled with inert gas or reductive gas. There is also a heating plate 20 and a cooling plate 21 at a rear surface of the stage 19, and temperature control is carried out by bringing either of these plates into contact with the rear surface of the stage 19 to conduct heat. Here, since heat is conducted stably and efficiently, carbon, which has high thermal conductivity and is easy to machine is used in the stage 19 and the heating plate 20, while corrosion resistant stainless steel is used in the cooling plate 21.

With this embodiment, carbon is used as the stage 19 and the heating plate 20, but it is possible use another material as long as it is a material with high thermal conductivity, or to select a suitable combination of materials. Also, curvature of the stage 19 is preferably made as low as possible, and formed as thin as possible to make heat capacity small.

When heating or cooling the semiconductor chip 1*a*, the reflow area 18 is filled with inert gas as required. As the gas the reflow area 18 is filled with, a gas that prevents oxidation of the solder surface and has an oxidation reduction effect, for example, nitrogen or argon as an inert gas, hydrogen or a gas including hydrogen as a reduction gas is used. In the cooling system, as well as the system of bringing the cooing plate 21 that is water-cooled into contact with the stage 19, it is possible to use a system where a coolant gas is blown against the rear surface of the stage 19, and it is in fact possible to select any system that a cooling capacity capable of realizing the effects of the present invention.

Also, by providing a non-contact type heat source 22 such as infrared rays above the reflow area 18, it becomes possible to heat the solder from above, and to cool the semiconductor chip 1*a* from the rear surface, and by increasing the temperature gradient between above and below the semiconductor chip 1*a*, it is made easy to deposit a preferred intermetallic compound at the solder bonding interface and it becomes possible to carry fine temperature control in order to form the combined solder alloy layer 6.

Figure 10:
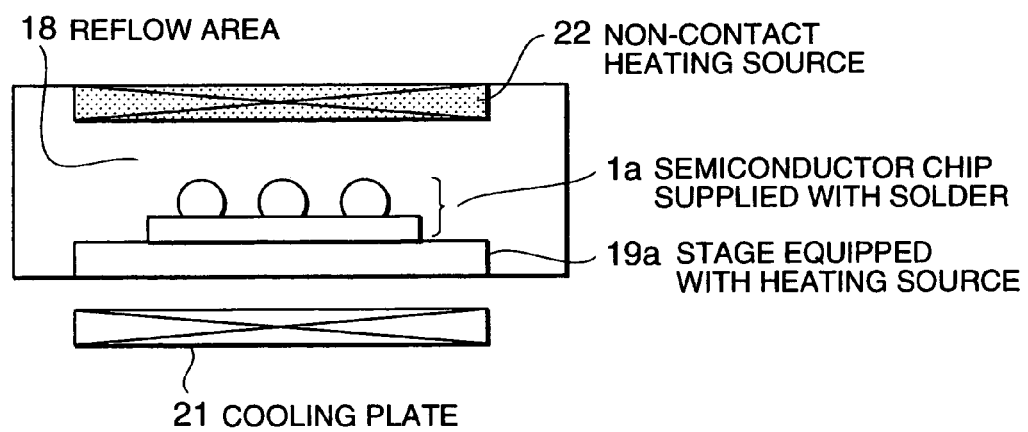
FIG. 10 is a cross sectional view showing another example of a reflow apparatus for forming the semiconductor device according to the second embodiment of the present invention.

As shown in FIG. 10, the semiconductor manufacturing apparatus, as well as the above described device structure, it is also possible to assemble a heat source, or cooling source, or indeed both a heat source and cooling source, into the stage 19*a*, and heating and cooling can be realized by building in a heater or through flow of a heating medium and a cooling medium. The form of the semiconductor on which solder bumps are formed is not limited to chip-type, and can also be collectively formed on a wafer.

Next, a manufacturing procedure for the semiconductor device according to this embodiment will described with reference to FIG. 11 and FIG. 12. FIG. 11A shows a procedure for the case of using only a heating plate 20 and a cooling plate 21 as the heating/cooling source, and performing reflow in a normal atmosphere, while FIG. 11B shows a procedure for the case of further using a non-contact type heat source 22 as the heat source, and filling the reflow area 18 with an inert gas.

First of all, in steps S101 and S201, a specified amount of solder alloy and flux are supplied to the UBM layer 5 of the semiconductor chip 1, or to the solder alloy making layer 8 formed on the UBM layer 5. As a supply system, it is possible to appropriately select a system capable of supplying the specified amount of solder, such as the solder ball loading system shown in FIG. 7, the electrolytic solder plating system shown in FIG. 8, or another solder paste printing system.

Figure 12A:
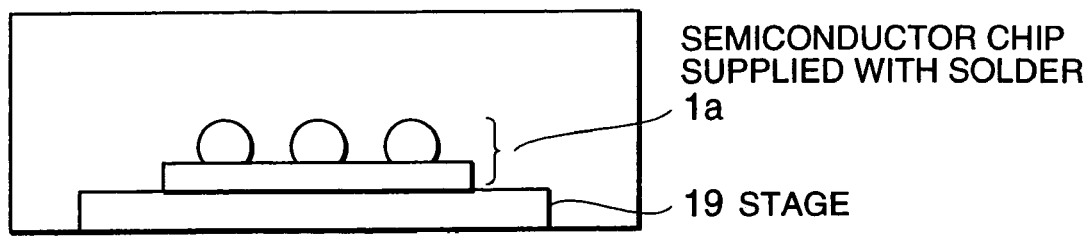
FIGS. 12A-12C are diagrams showing a partial manufacturing process for the semiconductor device according to the second embodiment of the present invention.

Next, in step S102 and S202, the semiconductor chip 1a to which solder has been supplied is mounted on the stage 19 inside the reflow apparatus (refer to FIG. 12A). After the reflow area 18 is sealed and decompressed to a specified pressure (step S203), the reflow area 18 is filled with nitrogen, hydrogen or a mixed gas containing hydrogen (step S204). This process is carried out in order to improve wettability of the solder by making the reflow area 18 a hypoxic concentration or a reductive atmosphere. When there is no inconvenience caused by wettability it is possible to suitably omit the process, as shown in FIG. 11A.

Figure 12B:
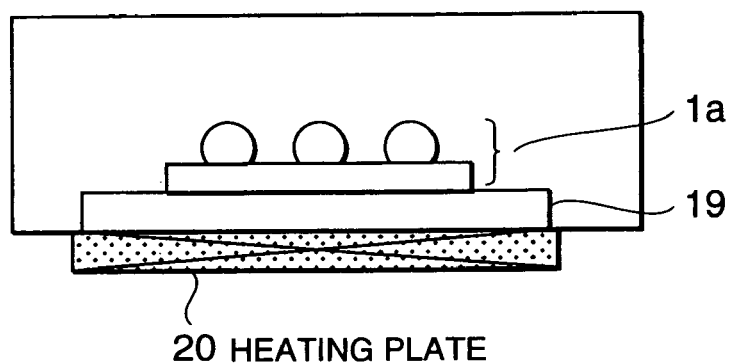

Next, in step S103 and S205, the heating plate 20 that has been heated to a set temperature is brought into contact with the rear surface of the stage 19, and the temperature of the solder is raised to a specified temperature higher than the melting point to melt the solder (refer to FIG. 12B). In the case of an apparatus provided with the non-contact type heat source 22, heating is carried out by operating this heat source as well. In this heating process, metal constituting the UBM layer 5 dissolves into the solder at the contact interface with the molten solder. Also, in the case where a wettability improvement layer 17 is formed as an upper layer of the UBM layer 5, the wettability improvement layer 17 and the UBM layer 5 dissolve in the solder one after the other.

Figure 12C:
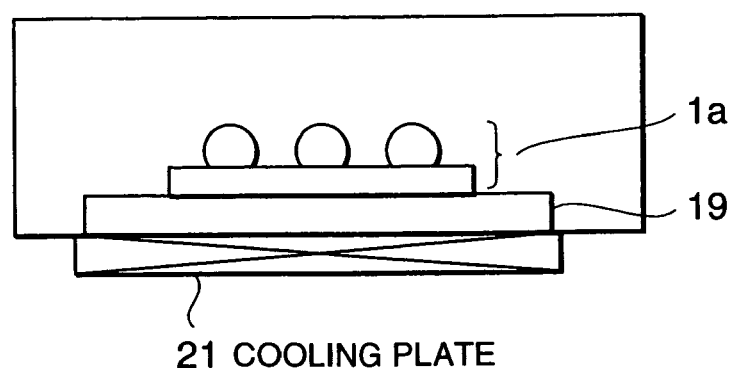

After that, in step S104 and S206, the heating plate 20 is taken away from the stage 19 and the cooling plate 21 is brought into contact with the rear surface of the stage 19 to commence cooling (refer to FIG. 12C). Here, since the semiconductor chip 1a is cooled from the reverse surface side, the temperature drops suddenly from the top of FIG. 12C to the bottom, generating a large temperature gradient, and the molten solder is solidified from the UBM layer 5 side. In this solidification process, an intermetallic compound having a higher melting point than the solder becomes a core for the UBM layer 5 being deposited, and a primary phase of an intermetallic compound of tin and atoms of the UBM layer 5 are deposited close to the UBM layer 5.

The intermetallic compound that will be deposited is an intermetallic compound of a metal comprising tin, being the main component of the solder, and the UBM layer 5, and an intermetallic compound of a metal comprising tin that is the main component of the solder and a metal different from the UBM layer 5 inside the solder, for example a metal constituting the solder alloy making layer 8, or an intermetallic compound of a metal comprising tin and a metal constituting the wettability improvement layer 17. These intermetallic compounds are simultaneously deposited in the vicinity of the UBM layer 5 with both phases causing formation of a combined solder alloy layer 6 (refer to FIG. 6), thus completing bump formation (step S105, S208). A temperature gradient inside the solder during the cooling process is intended to make the cooling rate extremely fast and to make deposition of a primary phase in the vicinity of the UBM layer easy, so the cooling rate can be made fast, for example, preferably greater than 2° C. per second.

In increasing the cooling rate in the vicinity of the UBM layer 5 interface, heating using the heating plate below the stage 19 and heating using the non-contact type heat source 22 such as the infrared rays provided above the reflow area 18 are carried out simultaneously, and heating is continuously performed from the upper part using the non-contact type heat source 22 even after cooling using the cooling late 21 in step 206 has started. By such combination of heating from below and cooling from above, a temperature difference of the semiconductor chip to which solder has been supplied is increased, which enables effective deposition of the intermetallic compound.

Figure 13:
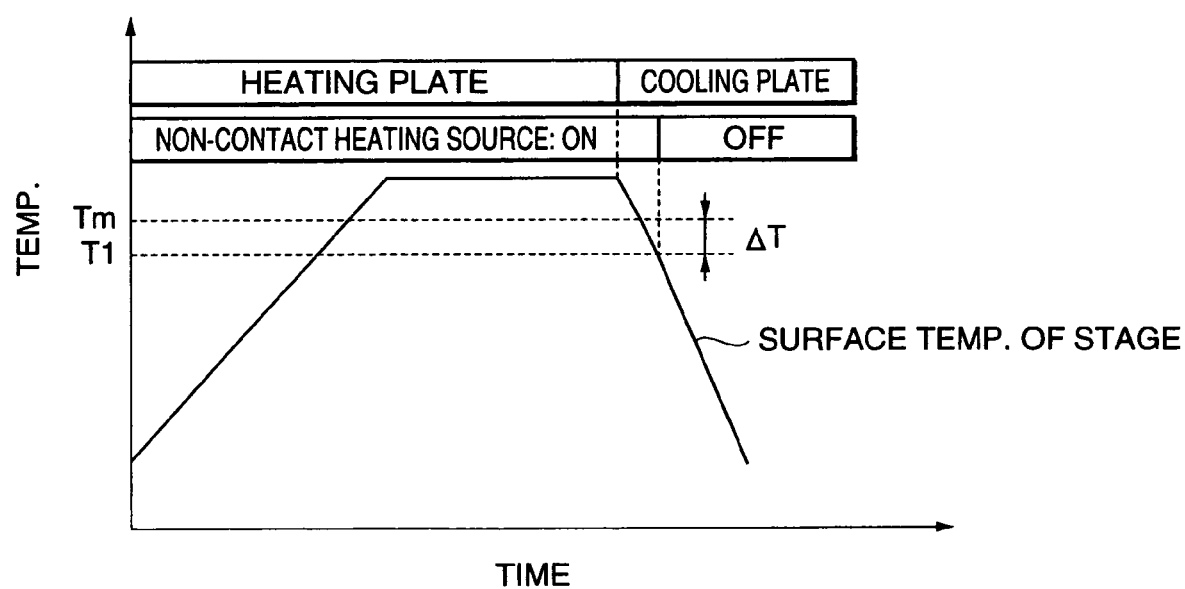
FIG. 13 is a diagram showing timing of the heating and cooling in the manufacturing process for the semiconductor device according to the second embodiment of the present invention.

This operation will be described with reference to FIG. 13. FIG. 13 shows surface temperature of the stage 19, timing for switching the heating plate 20 and the cooling plate 21, and ON/Off timing for the non-contact type heat source 22. The non-contact type heat source 22 is put into an ON state from heating initialization, and the semiconductor chip 1a is heated from above and below. At a point in time when a specified temperature higher than the melting point of the solder is reached, or when a specified time has elapsed from when the specified temperature higher than the melting point of the solder has been reached, a switch is made from the heating plate 20 to the cooling plate 21 to commence cooling, but the non-contact type heat source 22 is kept in the ON state until the temperature falls to a temperature T1 a few degrees (in this drawing: ΔT) lower than the melting point of the solder. By doing this, a temperature gradient inside the solder close to the melting point is further increased, and it is possible to reliably deposit the intermetallic compound in the vicinity of the UBM layer 5.

To carry out this type of control, a temperature sensor is provided for detecting temperature of the stage 19 or surface temperature of the semiconductor chip, it is necessary only to switch plates and switch the non-contact type heat source 22 on and off, and work is simplified by providing control means to automatically carry out these operations in the reflow apparatus. Also, with this embodiment, solder formation on the semiconductor chip has been disclosed, but it is possible to form solder with a similar method even if a semiconductor wafer is handled.

In this way, with the semiconductor manufacturing method according to the present invention and the semiconductor manufacturing apparatus used in the manufacturing method, it is possible to accurately control temperature of a semiconductor chip and a temperature gradient of front and rear surfaces by adjusting set temperature of the heating plate 20, the cooling plate 21 and the non-contact type heat source 22, and ON/OFF timing, and it is possible to reliably deposit an intermetallic compound at the interface of the solder bump 7 and the UBM layer 5. Also, the semiconductor chip 1a or a semiconductor wafer do not need to be conveyed during a reflow process, which means that there is no possibility of damage or bridges due to movement of the formed solder, and it is possible to improve product yield.

EXAMPLES

Embodiments of the present invention described will now be described specifically in more detail with reference to examples of the present invention.

Example 1

A specific manufacturing method for the semiconductor device shown in the first embodiment of the present invention will be described with reference to FIG. 2. First of all, titanium and titanium/tungsten alloy are sequentially sputtered on aluminum alloy wiring 2 formed on the semiconductor chip 1, as a contact layer 4. A nickel/vanadium alloy having a thickness of about 1-5 μm, as a UBM layer 5, and copper as a solder alloy making layer 8 are formed by sputtering on this contact layer 4. The copper film thickness at this time is optimally about 0.8 μm in the case of the electrode having a diameter of about 120 μm formed by the sequential sputtering and the solder ball having a diameter of about 150 μm made from a eutectic alloy of tin and silver.

A eutectic solder ball 9 having 96.5 weight % tin and 3.5 weight % silver is supplied together with flux to the electrode thus formed, heated to a temperature of at least 221° C., which is the melting point of the eutectic solder ball, and the solder ball 9 is melted. The solder ball 9 completely dissolves copper of the solder alloy making layer 8, and with cooling the solder takes on a hemispherical shape, and the solder alloy layer 6 that is a combination of the nickel/tin intermetallic compound and the copper/tin intermetallic compound is formed, thus completing bonding.

When the cross section of the thus formed solder bump is analyzed, as shown in FIG. 1, the above described combined solder alloy layer 6 that is a combination of the nickel/tin intermetallic compound and the copper/silver intermetallic compound is formed at an interface, and it is confirmed that there is almost no copper in the solder.

Because of the existence of the combined solder alloy layer 6 that is a combination of the nickel/tin intermetallic compound and the copper/silver intermetallic compound at an interface, even if heat history greater than the melting temperature of the solder is applied afterwards, this solder bump 7 exhibits the effect of suppressing formation of a reactive layer causing significant lowering of reliability due to dissolving or diffusion of the nickel that is the UBM layer 5.

This effect and the state in which the combined solder layer exists will now be described. Diffusion of the combined solder alloy layer 6 is suppressed because the combined solder alloy layer 6 exists in such a state that mutual diffusion paths for each of the nickel/tin intermetallic compound and the copper/tin intermetallic compound are blocked off, and in another state tin forms an intermetallic compound with respect to a solid solution of nickel and copper and exists as a three-element intermetallic compound, and even if this three-element intermetallic compound exists, paths for diffusion are cut off by the combined nickel and copper, to suppress mutual diffusion.

Here, the alloy solder layer 8 has been optimized to about 0.8 μm, but this effect is sufficiently exhibited with a film thickness of from 0.6 μm to 1.2 μm. The film thickness of the contact layer 4 and the UBM layer 5 can also be suitably varied according to the conditions of semiconductor device manufacture.

Example 2

Next a second example of the present invention will be described. Similarly to the above described first example, with the semiconductor device according to this example an electrode is formed by sequentially sputtering titanium and titanium/tungsten alloy as an contact layer 4 on aluminum alloy wiring 2 formed on a semiconductor chip 1, forming nickel/vanadium alloy to a thickness of 1-5 μm as a UBM layer on this contact layer 4 by sputtering, and also sputtering copper as a solder alloy making layer 8. The copper film thickness at this time is optimally about 0.8 μm in the case of the electrode formed by the sequential sputtering having a diameter of about 120 μm and the solder ball 9 made from eutectic alloy of tin and silver having a diameter of about 150 μm.

This example is characterized by the fact that tin is further supplied at a thickness of 0.5 to 1.0 μm onto this copper solder alloy making layer 8, and a combined solder alloy layer 6 that is a combination of an intermetallic compound of copper and tin and an intermetallic compound of nickel and tin is formed in advance by heating to at least 220° C., and even if specified solder is supplied to form a bump after that, the same effects as in the above described first example can be obtained.

With the first and second examples, the case has been shown of supplying solder in the form of a solder ball 9, but it is also possible to supply the solder as solder paste 10, as shown in FIG. 3.

Example 3

Figure 4:
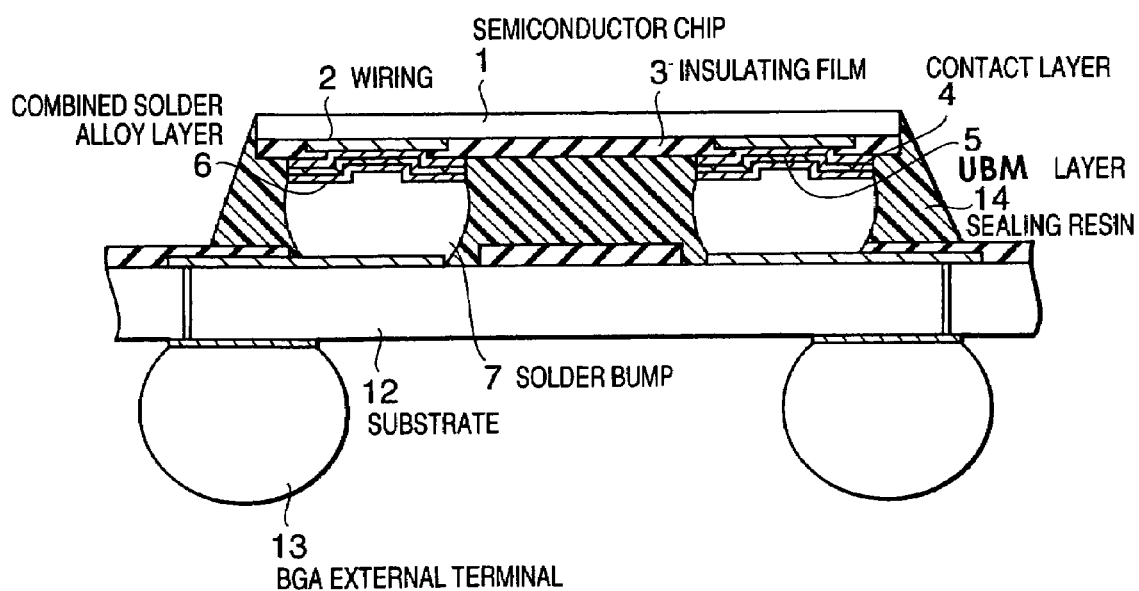
FIG. 4 is a cross sectional view showing the structure of a semiconductor device according to a third embodiment of the present invention.
Figure 5:
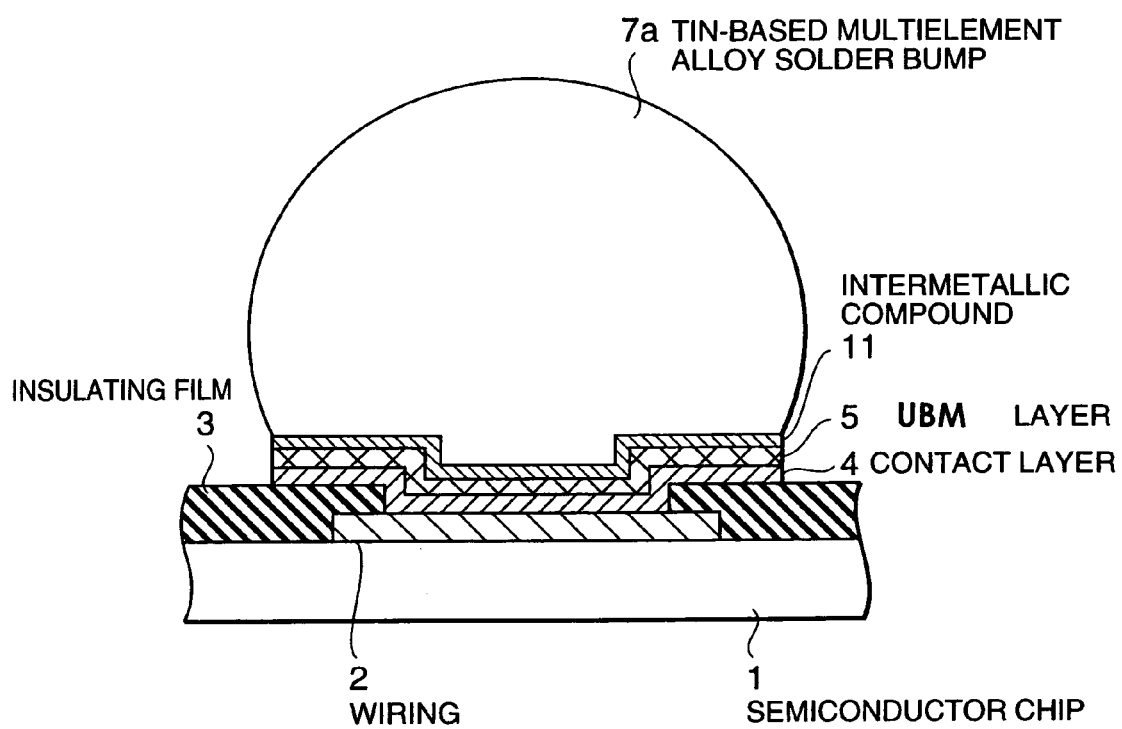
FIG. 5 is a cross sectional view showing the conventional structure of a semiconductor device.

Next, a third example of the present example will be described with reference to FIG. 4. FIG. 4 shows the structure of a semiconductor device implementing the semiconductor chip having the structure shown in the first example of the present invention. As shown in FIG. 4, a flip chip type semiconductor device has titanium and titanium/tungsten alloy sequentially sputtered on aluminum alloy wiring 2 formed on the semiconductor chip 1, as a contact layer 4. A nickel/vanadium alloy having a thickness of about 1-5 μm is formed by sputtering on this contact layer 4 as a UBM layer 5, and copper is also formed by sputtering as a solder alloy making layer 8. The copper film thickness at this time is optimally about 0.8 μm in the case of the electrode formed by the sequential sputtering having a diameter of about 120 μm and the solder ball 9 made from eutectic alloy of tin and silver having a diameter of about 150 μm.

A eutectic solder ball 9 formed having 96.5 weight % tin and 3.5 weight % silver is supplied together with flux to the electrode thus formed, heated to a temperature of at least 221° C., which is the melting point of the eutectic solder bail, and the solder ball 9 is dissolved. The solder ball 9 completely dissolves copper of the solder alloy making layer 8, and with cooling the solder takes on a hemispherical shape, and the solder alloy layer 6 that is a combination of the nickel/tin intermetallic compound and the copper/tin intermetallic compound is formed at an interface, to form a solder bump 7.

On the other hand, a substrate 12 having electrodes that have been supplied with solder having the same composition as the solder bump 7 is prepared in advance, the semiconductor chip 1 is positioned on the electrodes of this substrate 12, and then heated and melted to bond them together. After bonding, gaps between the solder bumps 7 are filled with sealing resin 14 in order to improve mechanical strength and moisture resistance. After that, solder having the same composition as the solder bumps 7 of the semiconductor chip 1 is then heated and melted to be attached as BGA external terminals 13.

Here, the solder bump 7 of the semiconductor chip 1 initially being attached is repeatedly subjected to heating to higher than the melting point in this manufacturing process, but since with the solder bumps 7 of the present invention it is possible to control dissolving and diffusion of the UBM layer, it is possible to provide a highly reliable semiconductor device with good yield.

Example 4

Figure 7A:
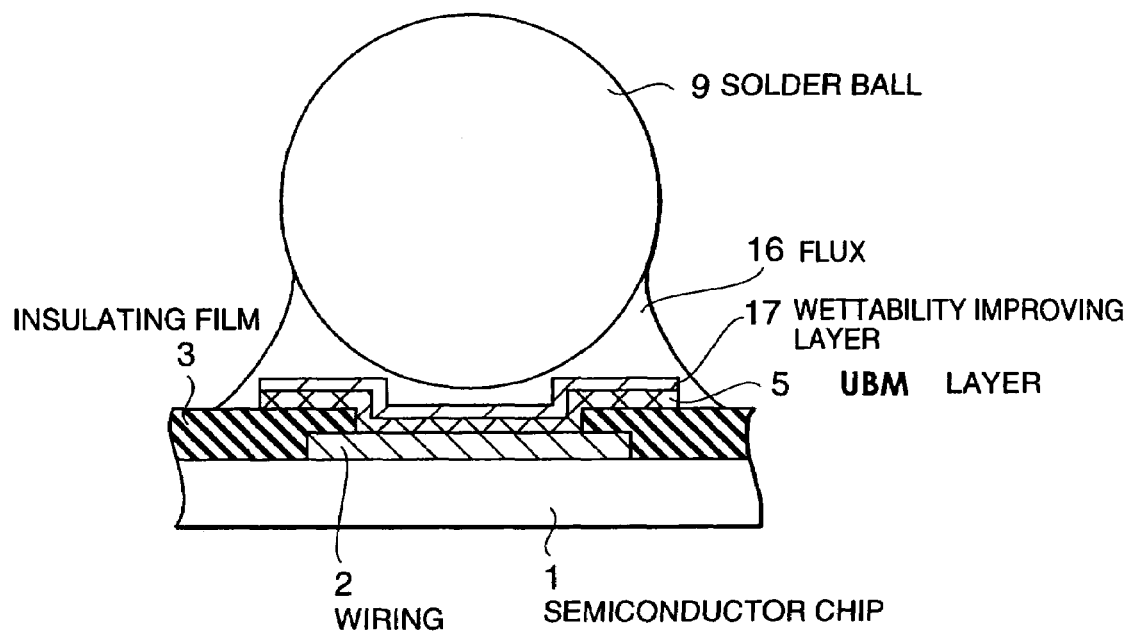
FIG. 7A is a cross sectional view showing the structure of the semiconductor device according to the second embodiment of the present invention before solder bump formation using a solder ball and a wettability improving layer.
Figure 7B:
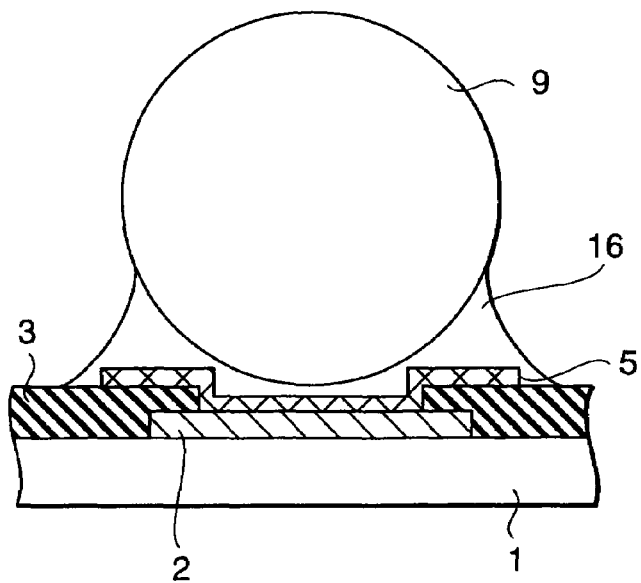
FIG. 7B is a cross sectional view showing the structure of the semiconductor device according to the second embodiment of the present invention before solder bump formation using a solder ball and not using a wettability-improving layer.
Figure 8A:
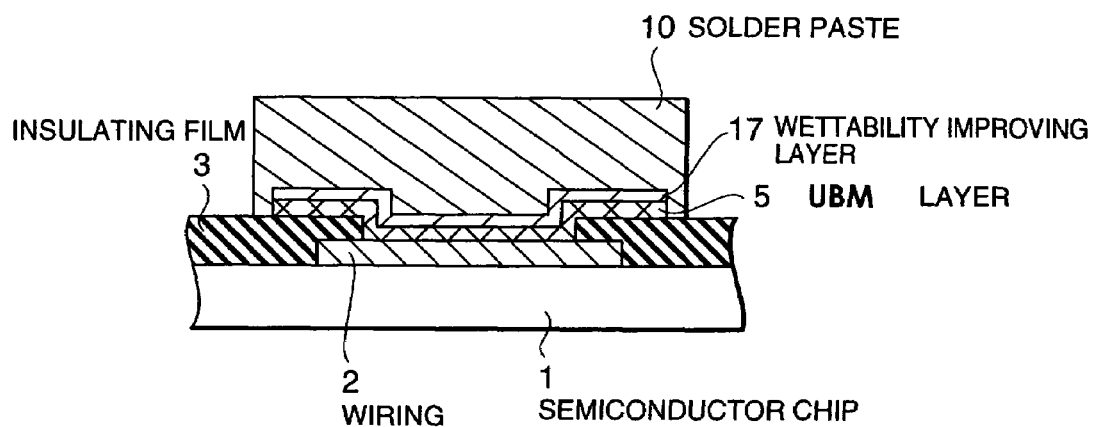
FIG. 8A is a cross sectional view showing the structure of the semiconductor device according to the second embodiment of the present invention before solder bump formation using solder paste and a wettability improving layer.
Figure 8B:
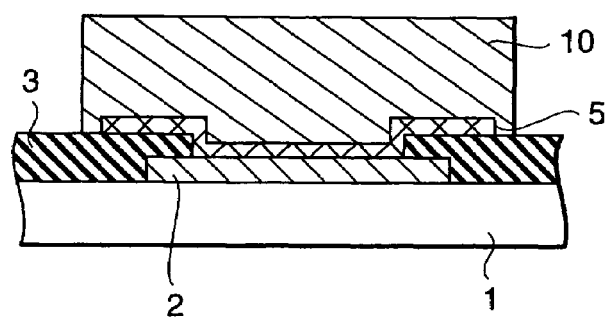
FIG. 8B is a cross sectional view showing the structure of the semiconductor device according to the second embodiment of the present invention before solder bump formation using solder paste and not using a wettability-improving layer.

Next, a method of manufacturing a semiconductor device using the semiconductor manufacturing apparatus represented by the second embodiment of the present invention will now be described with reference to FIG. 7 and FIG. 8. FIG. 7 and FIG. 8 show the structure of a semiconductor chip according to a fourth example, with FIG. 7A, 8A in each case showing the structure of a wettability improvement layer provided on a UBM layer, and FIG. 7B, 8B in each case showing the structure with no wettability improvement layer.

As shown in FIGS. 7A and 7B, the semiconductor chip of this example has a nickel/phosphorus layer of a UBM layer 5 formed using a nonelectrolytic plating method on Al electrodes to a thickness of about 5 μm, and gold plating is applied on this nickel/phosphorus layer to a thickness of about 0.05 μm as a wettability improvement layer 17. The diameter of the electrodes is about 120 μm. Also, solder is supplied using a ball mounting method, using balls of 150 μm diameter and a composition of tin 96.5 weight %/silver 3.0 weight %/copper 0.5 weight %.

After that, the semiconductor chip 1a supplied with solder is mounted on a stage 19 inside a reflow apparatus, and the inside of the reflow area 18 is first decompressed to about 10 Pa and then filled with nitrogen gas. After the pressure inside the reflow area 18 has been returned to atmospheric pressure, the flow amount of the nitrogen is set to about 15 liters/minute. Next, the heating plate 20 that has been heated to about 290° C. is brought into contact with the stage 19, and about 75 seconds after a temperature of 220° C. is reached, which is the melting point of the solder, the heating plate 20 is taken away, followed by bringing the cooling plate 21 into contact with the stage 19 and cooling to room temperature. In this case, the maximum temperature is 265±2° C., time above the melting point is 85±2 seconds, and cooling rate is about 4° C. per second. As a result of testing performed by the inventors of this application, it was confirmed that if the cooling rate was at least 2° C. per second the effects of the present invention were achieved.

Also, when the timing for switching between the heating plate 20 and the cooling plate 21 that are brought into contact with the stage 19 is controlled based on temperature, the system will be susceptible to the effects of variations in temperature between lots, so it is preferable to control based on time at a temperature greater than the melting point.

With respect to the semiconductor chip formed using the above described method, the bump cross section was observed and elementary analysis performed, and it was confirmed that an intermetallic compound, comprised of approximately 1 μm of tin, copper and nickel at a UBM layer 5/solder bumps 7 interface, covers the UBM layer 5. This can be considered as a layer formed by combination of intermetallic compounds of tin and copper, and tin and nickel.

Figure 14:
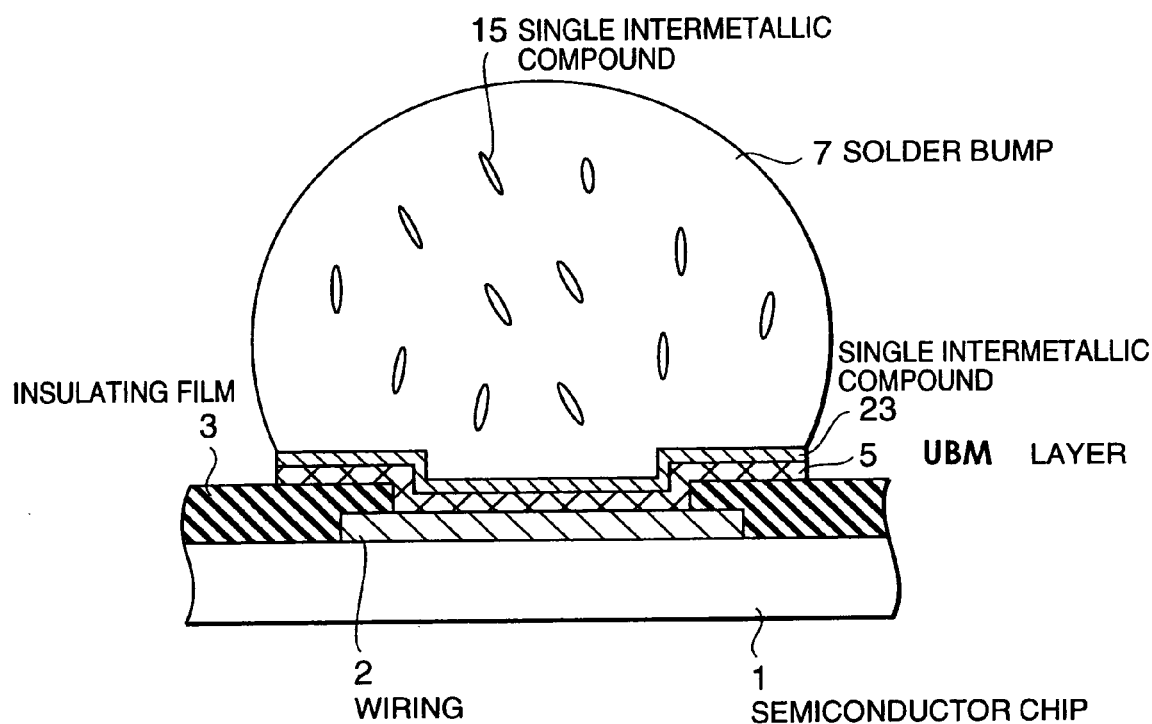
FIG. 14 is a cross sectional view showing the structure of a conventional semiconductor device.
Figure 15:
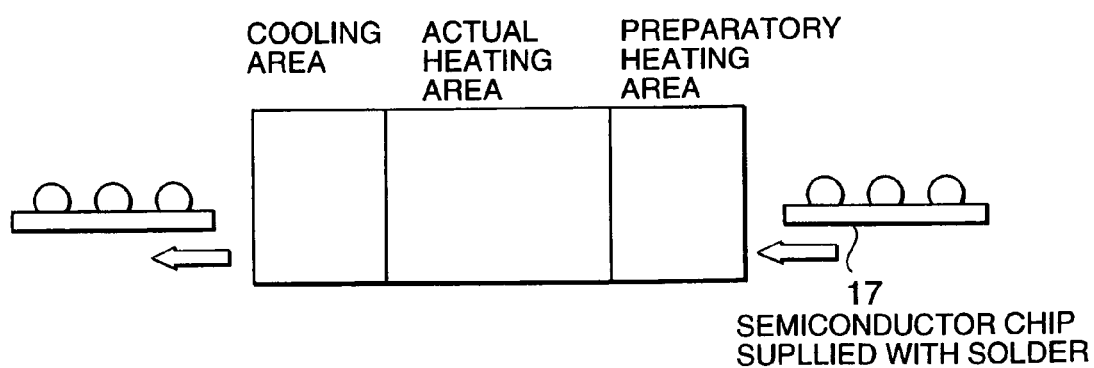
FIG. 15 is a schematic diagram showing the structure of a conventional solder reflow apparatus.

A semiconductor chip (FIG. 6) with bumps having the structure of the present invention attached and a semiconductor chip (FIG. 14) with bumps manufactured using a conventional reflow process attached were kept for 3,000 hours inside an oven at 150° C., and the rates at which the UBM layer 5 (nonelectrolytic Ni layer) were eaten away due to solid phase diffusion were compared in each. As a result of this, it was confirmed that compared to the Ni layer of the semiconductor chip having bumps formed with the conventional process being eaten away by 1.2 μm, with the present invention the Ni layer was eaten away by 0.1 μm, thus confirming that the effect of preventing eating away due to dissolving and diffusion of the UBM layer 5 was significant.

With the above described fourth example, the case where solder is supplied in the form of solder balls 9 has been shown, but it is also possible to supply the solder as solder paste 10, as shown in FIG. 8.

Example 5

Next, a semiconductor device of a fifth example of the present invention will be described. This example covers a manufacturing method for a semiconductor device using a reflow apparatus provided with a non-contact type heat source.

The semiconductor chip of this example has a UBM layer 5 of nickel/vanadium formed by sputtering on Al electrodes via a contact layer to a thickness of about 1 μm, and a copper wettability improvement layer 17 is formed on this UBM layer 5 to a thickness of about 0.4 μm by sputtering. The size of the electrode is the same as in the fourth example, a diameter of about 120 μm. Solder is supplied onto the semiconductor chip 1 by means of a ball mounting method for mounting two-element eutectic solder having a composition of tin 96.5 weight %/silver 3.5 weight % and having a diameter of 150 μm.

Decompression and nitrogen gas flow amount after mounting the semiconductor chip on the stage 19 of the reflow apparatus are the same as for the fourth example. With this example, a device provided with a non-contact type heat source 22 (infrared heater) above the reflow area 18 is used, and heating is carried out using both the heating plate 20 and the non-contact type heat source 22. The temperature of the heating plate 20 is set to 285° C., and the timing for switching from the heating plate 20 to the cooling plate 21 is the same as in the fourth example, namely 75 seconds after the melting point of 220° C. has been exceeded. The non-contact type heat source 22 is turned OFF when the temperature of the rear surface of the stage 19 is 215° C., which is 5° C. lower than the melting point of the solder. In this case, the maximum temperature is 262±2° C., time above the melting point is 84±2 seconds, and cooling rate is about 4° C. per second. Similarly to the fourth embodiment described above, it is sufficient that the cooling rate is 2° C. per second or more.

The cross section of the semiconductor chip to which bumps formed using the above described method have been attached was observed and elementary analysis performed, and it was confirmed that an intermetallic compound comprised of tin, copper and nickel, similarly to the fourth example, was formed to a thickness of 0.8 μm at the UBM layer 5/solder bumps 7 interface.

With the fourth example, since three-element solder of tin/silver/copper is supplied onto the UBM layer 5 (nickel), solder supply using an electrolytic plating method is not possible, but with this example it is possible to use two-element solder of tin/silver because a copper layer is formed in advance on the UBM layer 5 (nickel), and solder supply using an electrolytic plating method is also possible.

As has been described above, a solder alloy making layer for preventing dissolving and diffusion of tin is thinly formed, alloy solder is supplied in solder paste or solder ball form, and a solder alloy layer is formed by heating and melting. The solder alloy layer is comprised of a combination of two intermetallic compounds, one intermetallic compound being formed from metal constituting the solder and the solder alloy making layer, and the other intermetallic compound being formed from metal constituting the solder and a UBM layer. By thinly providing the solder alloy making layer on an upper part of the UBM layer in advance, an obtained solder bump structure has a bonding interface formed by the alloy solder and a combined intermetallic compound layer which is formed by combining a first intermetallic compound formed by a reaction between metal constituting the solder and the solder alloy making layer and a second intermetallic compound formed by a reaction between metal constituting the solder and the UBM layer. When the combined intermetallic compound layer that is a combination of the first and second intermetallic compounds is formed, the first intermetallic compound is formed by the entire thin solder alloy making layer at almost the same time as the second intermetallic compound.

Accordingly, the first intermetallic compound layer has the function of blocking a diffusion path that allows growth of the second intermetallic compound. Under normal circumstances the intermetallic compound layer of the tin in the solder and the UBM layer would be grown due to diffusion. However, growth of the second intermetallic compound is suppressed due to the fact that the first intermetallic compound is arranged in diffusion paths such as the grain boundary, and therefore it is possible to obtain a highly reliable bonding interface that degrades little with age with respect to repeated heat history during assembly, or temperature variations due to usage conditions after packaging, and it is possible to provide a semiconductor device having a solder bump structure that can be formed at low cost using a conventional tin-based two-element alloy.

Also, the structure of solder bump connection sections formed on the electrodes of the semiconductor chip proposed in the present invention suppresses dissolving and diffusion of the UBM layer into the solder by forming the combined intermetallic compound layer at the UBM layer interface, and it is possible to provide a highly reliable semiconductor device that does not suffer from any lowering of strength due to abnormal growth of the intermetallic compound layer even if there is a heat history greater than the melting point at the time of package assembly or heat history under actual usage conditions. This has particularly noticeable effects in the case of lead free solder which has an increased proportion of tin contained therein compared with tin/lead eutectic solder and therefore has a lot of problems with respect to reliability.

Further, with the present invention fine temperature control of the semiconductor device is possible due to the fact that a heating plate and a cooling plate for heating and cooling the semiconductor chip from below, and also a non-contact type heat source for heating the semiconductor chip from above, are provided in the reflow apparatus, and by heating the semiconductor chip from above using the non-contact type heat source, even after switching from the heating plate to the cooling plate, it is possible to increase a temperature gradient of the front and rear surface of the semiconductor chip and it is possible to form the intermetallic compound layer of the UBM layer as expected from material design. With the reflow apparatus according to the present invention, since it is not necessary to convey a semiconductor chip or semiconductor wafer during the process, there is no possibility of damage to the semiconductor chip or of bridges occurring due to movement of the formed solder, resulting in improved product yield.

The present invention is not limited to the above described embodiments and examples, and it should be understood that various modifications are possible within the scope of the appended claims without departing from the technical concept of the present invention.

What is claimed is:

1. A semiconductor device manufacturing method, comprising the steps of:
    forming, on a wiring layer, an under-bump layer, including first metal which is to form a first intermetallic compound at an interface through reaction with alloy solder;
    forming a metal layer made of second metal which is to form a second intermetallic compound through reaction with the alloy solder;
    supplying the alloy solder; and
    forming an alloy layer at an interface between the under-bump layer and the alloy solder by cooling after temporary fusing of the alloy solder, wherein the alloy layer is a combination of the first intermetallic compound and the second intermetallic compound.

2. The semiconductor device manufacturing method according to claim 1, wherein an oxidation prevention film made of gold is further thinly formed on the metal layer.

3. The semiconductor device manufacturing method according to claim 1, further comprising the step of, before forming the under-bump layer on the wiring layer, forming a contact layer for maintaining adhesion of the wiring layer and the under-bump layer.

4. The semiconductor device manufacturing method according to claim 1, wherein, when forming the solder bump, fusing of the alloy solder and deposition of the intermetallic compound are carried out by setting a temperature of an interface of the solder bump with the under-bump layer to lower than a temperature at the top of the solder bump on a specified temperature gradient.

5. The semiconductor device manufacturing method according to claim 1, wherein, when forming the solder bump, fusing of the alloy solder and deposition of the intermetallic compound are carried out by mounting the semiconductor device on a stage and causing a heating plate and a cooling plate movably provided at a lower part of the stage to be sequentially brought into contact with the stage.

6. The semiconductor device manufacturing method according to claim 5, wherein, at the time of heating using the heating plate, the semiconductor device is also heated from above by a non-contact heater provided at an upper part of the semiconductor device, and at the time of cooling using the cooling plate, while continuing heating using the non-contact heater, a temperature gradient between the top of solder bump and the interface of the solder bump with the under-bump layer is increased to promote deposition to the interface of the intermetallic compound with the under-bump layer.

7. The semiconductor device manufacturing method according to claim 5, wherein cooling using the cooling plate is carried out at cooling rate of at least 2° C. per second.

8. The semiconductor device manufacturing method according to claim 5, wherein the heating using the heating plate and the cooling using the cooling plate are carried out under a vacuum atmosphere of a specified gas.

9. The semiconductor device manufacturing method according to claim 8, wherein the specified gas includes one of an inert gas and a reductive gas.

10. The semiconductor device manufacturing method according to claim 9, wherein the inert gas comprises one of nitrogen and argon, and the reductive gas comprises one of hydrogen and a mixed gas including hydrogen.

11. The semiconductor device manufacturing method according to claim 1, wherein the under-bump layer is formed from one of a single film and a laminate of a plurality of films made of one selected from a group consisting of nickel, nickel alloy, copper and copper alloy which are formed by sputtering.

12. The semiconductor device manufacturing method according to claim 1, wherein the under-bump layer is formed from one of a single film and a laminate of a plurality of films made of one selected from a group consisting of nickel, nickel alloy, copper and copper alloy which are formed by one of nonelectrolytic plating and electrolytic plating.

13. The semiconductor device manufacturing method according to claim 1, wherein the under-bump layer is formed as a laminate film of a film made of one selected from a group consisting of nickel, nickel alloy, copper and copper alloy which are formed by the spattering and a film made of one selected from a group consisting of nickel, nickel alloy, copper and copper alloy which are formed by one of nonelectrolytic plating and electrolytic plating.

14. The semiconductor device manufacturing method according to claim 1, wherein the metal layer includes a copper thin film formed by at least one of sputtering, nonelectrolytic plating, and electrolytic plating.

15. The semiconductor device manufacturing method according to claim 14, wherein a film thickness of the metal layer is set so that the metal layer fuses totally into the alloy solder when fusing the alloy solder, and, when cooling the alloy solder, at least some of metal of the metal layer is deposited from the alloy solder.

16. The semiconductor device manufacturing method according to claim 1, wherein the alloy solder is supplied as one of a ball and pellet formed to a specified amount.

17. The semiconductor device manufacturing method according to claim 1, wherein the alloy solder is supplied as solder paste.

18. The semiconductor device manufacturing method according to claim 1, wherein the main component of the alloy solder is tin.

19. The semiconductor device manufacturing method according to claim 18, wherein a second main component of the alloy solder after tin is silver.

20. The semiconductor device manufacturing method according to claim 18, wherein copper is added to the alloy solder.

* * * * *